US012686792B2

(12) United States Patent
Mae

(10) Patent No.: US 12,686,792 B2
(45) Date of Patent: Jul. 21, 2026

(54) POLISHING COMPOSITION, POLISHING METHOD, AND METHOD FOR PRODUCING SEMICONDUCTOR SUBSTRATE

(71) Applicant: FUJIMI INCORPORATED, Kiyosu (JP)

(72) Inventor: Ryota Mae, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 350 days.

(21) Appl. No.: 17/942,344

(22) Filed: Sep. 12, 2022

(65) Prior Publication Data

US 2023/0090620 A1 Mar. 23, 2023

(30) Foreign Application Priority Data

Sep. 17, 2021 (JP) ................................ 2021-151945

(51) Int. Cl.
*C09G 1/02* (2006.01)
*H10P 52/40* (2026.01)

(52) U.S. Cl.
CPC .............. *C09G 1/02* (2013.01); *H10P 52/402* (2026.01)

(58) Field of Classification Search
None
See application file for complete search history.

(56) References Cited

U.S. PATENT DOCUMENTS

| | | | | |
|---|---|---|---|---|
| 2006/0037251 | A1* | 2/2006 | Kurata | H01L 21/3212 106/3 |
| 2012/0171936 | A1* | 7/2012 | Haerle | C01G 25/02 51/308 |
| 2013/0083425 | A1* | 4/2013 | Tamaki | G11B 5/8404 |
| 2016/0319160 | A1* | 11/2016 | Prevo | C09G 1/16 |
| 2020/0062997 | A1* | 2/2020 | Onishi | H01L 21/3212 |
| 2020/0095466 | A1* | 3/2020 | Kadohashi | H01L 21/31053 |
| 2021/0079264 | A1* | 3/2021 | Mae | H01L 21/31053 |
| 2021/0095161 | A1* | 4/2021 | Yoshizaki | C09G 1/02 |
| 2021/0139739 | A1* | 5/2021 | Yoshizaki | C08L 71/02 |

FOREIGN PATENT DOCUMENTS

| | | | | |
|---|---|---|---|---|
| JP | 2005-197664 A | 7/2005 | | |
| JP | 2015-189784 A | 11/2015 | | |
| KR | 20190072981 A * | 6/2019 | | C09G 1/02 |
| TW | 202012585 A | 4/2020 | | |

OTHER PUBLICATIONS

JP Notice of Reasons for Refusal issued in corresponding Japanese Application No. 2021-151945 Dated Apr. 1, 2025 (9 pages).
TW Office Action issued in corresponding TW Application No. 111133506 Dated Aug. 11, 2025 (18 pages).
KR Notice of Preliminary Rejection issued in corresponding KR Patent Application No. 10-2022-0112559 dated Mar. 12, 2026 (14 pages).

* cited by examiner

*Primary Examiner* — Shamim Ahmed
(74) *Attorney, Agent, or Firm* — Foley & Lardner LLP

(57) ABSTRACT

A polishing composition according to the present invention contains zirconia particles, a selectivity improver for improving a ratio of a polishing speed for an organic material (b) to a polishing speed for a material (a) having a metal-nitrogen bond, and a dispersing medium, wherein in a particle size distribution of the zirconia particles obtained by a laser diffraction/scattering method, a diameter (D50) of the particles when a cumulative volume of the particles from a fine particle side reaches 50% of a total volume of the particles is 5 nm or more and 150 nm or less, and a pH of the polishing composition is less than 7.

20 Claims, No Drawings

POLISHING COMPOSITION, POLISHING METHOD, AND METHOD FOR PRODUCING SEMICONDUCTOR SUBSTRATE

CROSS-REFERENCE TO RELATED APPLICATION

The present application is based on Japanese Patent Application No. 2021-151945 filed on Sep. 17, 2021, the entire disclosure of which is incorporated herein by reference.

TECHNICAL FIELD

The present invention relates to a polishing composition, a polishing method, and a method for producing a semiconductor substrate.

BACKGROUND ART

As a semiconductor device becomes highly integrated, there is an increasing demand for more fine patterns and multi-layered circuitry. For this purpose, films of various substances having different etching selectivity characteristics are required. Among the films of such various substances, an organic film has better etching selectivity characteristics than other silicon-containing films and can thus be used as a mask film or a sacrificial film. In particular, in a semiconductor producing process, a chemical mechanical polishing (CMP) process is required to remove the organic film for planarization.

As a technique for polishing such an organic film, for example, JP 2015-189784 A discloses a polishing agent comprising abrasive grains containing silica, an allylamine polymer, and water, wherein a mass ratio of a content of the allylamine polymer to a content of the abrasive grains is 0.002 to 0.400, and the abrasive grains have a positive charge in the polishing agent.

SUMMARY OF INVENTION

However, the technique described in JP 2015-189784 A has a problem that the polishing speed for the organic film (organic material) is still low. Further, recently, there has been an increasing demand for increasing the polishing speed for an organic material relative to the polishing speed for a material having a metal-nitrogen bond, but such a demand has hardly been studied.

Therefore, an object of the present invention is to provide a means capable of polishing an organic material at a high polishing speed and improving the ratio of the polishing speed for the organic material to the polishing speed for the material having a metal-nitrogen bond.

In order to solve the above problems, the present inventors have conducted extensive studies. As a result, the present inventors have found that the above problems can be solved by a polishing composition comprising zirconia particles, a selectivity improver for improving a ratio of a polishing speed for an organic material (b) to a polishing speed for a material (a) having a metal-nitrogen bond, and a dispersing medium, wherein in a particle size distribution of the zirconia particles obtained by a laser diffraction/scattering method, a diameter (D50) of the particles when a cumulative volume of the particles from a fine particle side reaches 50% of a total volume of the particles is 5 nm or more and 150 nm or less, and a pH of the polishing composition is less than 7, thereby completing the present invention.

DESCRIPTION OF EMBODIMENTS

Hereinafter, embodiments of the present invention will be described. The present invention is not limited to only the following embodiments. In the present specification, unless otherwise specified, operations and measurements of physical properties and the like are performed under conditions of room temperature (20° C. or more and 25° C. or less) and a relative humidity of 40% RH or higher and 50% RH or lower. Further, in the present specification, the ratio of the polishing speed for an organic material (b) to the polishing speed for a material (a) having a metal-nitrogen bond is also simply referred to as “selectivity (selection ratio)”.

A polishing composition according to the present invention contains zirconia particles, a selectivity improver for improving a ratio of a polishing speed for an organic material (b) to a polishing speed for a material (a) having a metal-nitrogen bond, and a dispersing medium, wherein in a particle size distribution of the zirconia particles obtained by a laser diffraction/scattering method, a diameter (D50) of the particles when a cumulative volume of the particles from a fine particle side reaches 50% of a total volume of the particles is 5 nm or more and 150 nm or less, and a pH of the polishing composition is less than 7. The polishing composition according to the present invention having such a configuration can polish the organic material (b) at a high polishing speed, and can improve the ratio of the polishing speed for the organic material (b) to the polishing speed for the material (a) having a metal-nitrogen bond.

Object to be Polished

An object to be polished according to the present invention preferably contains a material (a) having a metal-nitrogen bond and an organic material (b).

Examples of the material (a) having a metal-nitrogen bond (hereinafter, also simply referred to as “material (a)”) include silicon nitride ($Si_3N_4$), tantalum nitride (TaN), and titanium nitride (TiN).

Examples of the organic material (b) (hereinafter, also simply referred to as “material (b)”) include, but are not particularly limited to, amorphous carbon, spin-on-carbon (SOC), diamond-like carbon (DLC), nanocrystalline diamond, and graphene. Among these, amorphous carbon, spin-on carbon, or diamond-like carbon is preferable.

Films containing the material (a) and films containing the material (b) can be formed by a chemical vapor deposition method (CVD), a physical vapor deposition method (PVD), a spin coating method, or the like.

The object to be polished according to the present invention may further contain other materials in addition to the material (a) and the material (b). Examples of the other materials include silicon oxide, single-crystalline silicon, polycrystalline silicon (polysilicon), amorphous silicon, polycrystalline silicon doped with n-type or p-type impurities, amorphous silicon doped with n-type or p-type impurities, an elemental metal, and SiGe.

Examples of the object to be polished containing silicon oxide include a tetraethyl orthosilicate (TEOS) type silicon oxide surface (hereinafter, also simply referred to as “TEOS”, or “TEOS film”) formed using tetraethyl orthosilicate as a precursor, a high density plasma (HDP) film, an undoped silicate glass (USG) film, a phosphorus silicate glass (PSG) film, a boron-phospho silicate glass (BPSG) film, and a rapid thermal oxidation (RTO) film.

Examples of the elemental metal include tungsten, copper, cobalt, hafnium, nickel, gold, silver, platinum, palladium, rhodium, ruthenium, iridium, and osmium.

[Zirconia Particles]

The polishing composition according to the present invention contains zirconia particles as abrasive grains. The zirconia particles have the function of mechanically polishing the object to be polished. The zirconia particles may be used singly or in combination of two or more kinds thereof. As the zirconia particles, commercially available products may be used or synthetic products may be used.

Usually, zirconia contains hafnia ($HfO_2$), which is an inevitable impurity. In the present specification, the numerical values related to the composition such as the content are numerical values calculated by regarding hafnia ($HfO_2$), which is an inevitable impurity, as zirconia (ZrO).

The zirconia particles are preferably colloidal zirconia particles or crushed/calcined zirconia particles, and more preferably colloidal zirconia particles. The zirconia particles may also be undoped or doped with, for example, yttrium (Y) or an oxide thereof. The crushed/calcined zirconia particles are prepared by calcination in a calcining furnace followed by a crushing step. More specifically, the object to be calcined is heated from room temperature (for example, 20 to 25° C.) over, for example, 1 to 10 hours, 1.2 to 5 hours, typically about 2 hours. The heating rate at that time is, for example, 100 to 1000° C./hour, or 200 to 800° C./hour. Thereafter, the calcination temperature is set to about 1300 to 1500° C., and held within the temperature range for, for example, 1 to 3 hours, typically about 2 hours. Then, natural cooling is performed at room temperature. The time from heating of the object to be calcined to cooling thereof to room temperature by natural cooling is, for example, 3 to 20 hours, typically 7 to 8 hours.

In a case where calcined/crushed zirconia is used as a raw material, the zirconia particles doped with yttrium or an oxide thereof (hereinafter, also simply referred to as "Y-stabilized zirconia particles") are suitably prepared by mixing a zirconia powder and an yttrium powder at a ratio such that a predetermined doping amount of yttrium is obtained before the above-described calcination, and calcining the mixture as described above. In a case where colloidal zirconia is used as a raw material, the doped zirconia particles are generally prepared by reacting necessary numbers of moles of precursors of yttrium and zirconium in advance and then granulating the reaction product. With respect to the doping method, for example, the contents of JP 2010-523451 A and U.S. Pat. No. 3,110,681 B can be appropriately referred to.

The concentration of yttrium in terms of $Y_2O_3$ (mol %) in Y-stabilized zirconia particles is defined as follows.

$$Y_2O_3(\text{mol }\%)=\{(\text{moles of }Y_2O_3)/[(\text{moles of }Y_2O_3)+(\text{moles of }ZrO_2)]\}\times 100 \quad \text{[Math. 1]}$$

The mole % of yttrium may be determined by x-ray fluorescence (XRF) method, or any other method known in the art. The concentration of yttrium in the Y-stabilized zirconia particles is at least 3 mol %, 4 mol %, 5 mol %, 6 mol %, 7 mol %, 8 mol %, 9 mol %, 10 mol %, 11 mol %, 12 mol %, 13 mol %, 14 mol %, or 15 mol %. Also, the concentration of yttrium in the Y-stabilized zirconia particles is less than 45 mol %, 40 mol %, 35 mol %, 30 mol %, 25 mol %, or 20 mol %. The concentration of yttrium in the Y-stabilized zirconia particles is 1 mol %, 2 mol %, 3 mol %, 4 mol %, 5 mol %, 6 mol, 7 mol %, 8 mol %, 9 mol %, 10 mol %, 11 mol %, 12 mol %, 13 mol %, 14 mol %, 15 mol %, 16 mol %, 17 mol %, 18 mol %, 19 mol %, 20 mol %, 21 mol %, 22 mol %, 23 mol %, 24 mol %, or 25 mol %, or somewhere in between.

The concentration of yttrium in the Y-stabilized zirconia particles is 1 mol % or more or less, 2 mol or more or less, 3 mole or more or less, 4 mol % or more or less, 5 mol % or more or less, 6 mol % or more or less, 7 mol % or more or less, 8 mol % or more or less, 9 mole or more or less, 10 mol % or more or less, 11 mol, or more or less, 12 mol % or more or less, 13 mol % or more or less, 14 mol % or more or less, 15 mol % or more or less, 16 mol % or more or less, 17 mol % or more or less, 18 mol % or more or less, 19 mol % or more or less, 20 mol % or more or less, 21 mole or more or less, 22 mol % or more or less, 23 mol % or more or less, 24 mol % or more or less, or 25 mol % or more or less. In some embodiments, the Y-stabilized zirconia particles contains a tetragonal phase (e.g., the yttrium in the Y-stabilized zirconia particles is in a concentration sufficient to provide a tetragonal phase). In some embodiments, the Y-stabilized zirconia particles contains a cubic phase (e.g., the yttrium in the Y-stabilized zirconia particles is in a concentration sufficient to provide a cubic phase). In some embodiments, the concentration of yttrium in the Y-stabilized zirconia particles is more than 2.6 mol %, more than 3.3 mol %, more than 9.3 mol %, or more than 10.6 mol %. In the present specification, the expression "X (X is a numerical value) or more or less" means that it may be X or more or may be X or less in this specification. That is, when an amendment is made, the numerical value X can be used as the basis of the lower limit value and the basis of the upper limit value.

Zirconia particles (e.g., colloidal zirconia or crushed/calcined zirconia or doped zirconia) are primary particles and/or aggregates containing secondary particles. Aggregates may be formed from combinations of individual particles, which are known in the art as primary particles, whereas aggregated combinations of the particles are known in the art as secondary particles. The zirconia particles in the polishing composition may be in the form of primary particles or in the form of secondary particles, which are aggregates of primary particles. Alternatively, the zirconia particles may be present both in the form of primary particles and in the form of secondary particles. In a preferred embodiment, the zirconia particles are present at least partially in the form of secondary particles in the polishing composition.

In the zirconia particles according to the present invention, in the particle size distribution of the zirconia particles obtained by a laser diffraction/scattering method, the diameter (D50, hereinafter also simply referred to as "D50") of the particles when the cumulative volume of the particles from a fine particle side reaches 50% of the total volume of the particles is 5 nm or more and 150 nm or less. In a case where the D50 of the zirconia particles is less than 5 nm, the polishing speed is extremely reduced. On the other hand, in a case where the D50 of the zirconia particles exceeds 150 nm, scratches may occur on the surface after polishing. The D50 of the zirconia particles is preferably 10 nm or more, more preferably 30 nm or more, and still more preferably 50 nm or more. Further, the D50 of the zirconia particles is preferably 90 nm or less. That is, the D50 of the zirconia particles is preferably 10 nm or more and 150 nm or less, more preferably 30 nm or more and 150 nm or less, and still more preferably 50 nm or more and 90 nm or less. More specifically, the D50 of the zirconia particles can be measured by the method described in Examples.

The shape of the zirconia particles is not particularly limited, and may be a spherical shape or a non-spherical shape. Specific examples of non-spherical shapes include various shapes such as polygonal columns such as a triangular column and a quadrangular column, a cylindrical shape, a bale shape in which the central portion of a cylinder is bulged more than the end portion, a donut shape in which the central portion of a disc penetrates, a tabular shape, a so-called cocoon shape having a constriction at the central portion, a so-called associated spherical shape in which a plurality of particles are integrated, a so-called konpeito shape having a plurality of bulges on the surface, a rod shape, a rhombus shape, a square shape, and a rugby ball shape, and the shape is not particularly limited.

The lower limit of the zeta potential of the zirconia particles in the polishing composition is, but is not particularly limited to, preferably 10 mV or more, more preferably 20 mV or more, still more preferably 25 mV or more, and particularly preferably 30 mV or more. Further, the upper limit of the zeta potential of the zirconia particles in the polishing composition is, but is not particularly limited to, preferably 70 mV or less, more preferably 65 mV or less, still more preferably 55 mV or less, and particularly preferably 50 mV or less. That is, the zeta potential of the abrasive grains in the polishing composition is preferably 10 mV or more and 70 mV or less, more preferably 20 mV or more and 65 mV or less, still more preferably 25 mV or more and 55 mV or less, and particularly preferably 30 mV or more and 50 mV or less.

With the zirconia particles having such a zeta potential, the organic material (b) can be polished at a higher polishing speed.

In the present specification, a value measured by the method described in Examples is adopted as the zeta potential of the zirconia particles. The zeta potential of the zirconia particles can be adjusted by the pH or the like of the polishing composition.

The content (concentration) of the zirconia particles in the polishing composition is, but is not particularly limited to, preferably 0.01% by mass or more, more preferably 0.05% by mass or more, still more preferably 0.08% by mass or more, and particularly preferably more than 0.1% by mass, based on the total mass of the polishing composition. Further, the upper limit of the content of the zirconia particles in the polishing composition is preferably 10% by mass or less, more preferably 5% by mass or less, still more preferably 4% by mass or less, yet still more preferably 1% by mass or less, and particularly preferably less than 1% by mass, based on the total mass of the polishing composition. That is, the content of the zirconia particles is preferably 0.01% by mass or more and 10% by mass or less, more preferably 0.05% by mass or more and 5% by mass or less, still more preferably 0.08% by mass or more and 4% by mass or less, yet still more preferably 0.08% by mass or more and 1% by mass or less, and particularly preferably more than 0.1% by mass and less than 1% by mass, based on the total mass of the polishing composition.

When the content of the zirconia particles is within such a range, the organic material (b) can be polished at a higher polishing speed. In a case where the polishing composition contains two or more kinds of zirconia particles, the content of the zirconia particles is intended to be the total amount of these.

The polishing composition according to the present invention may further contain abrasive grains other than the zirconia particles (other abrasive grains) as long as the effects of the present invention are not impaired. Such other abrasive grains may be any of inorganic particles, organic particles, and organic-inorganic composite particles. Specific examples of the inorganic particles include particles formed of metal oxides such as unmodified silica, cation-modified silica, alumina, ceria, and titania, silicon nitride particles, silicon carbide particles, and boron nitride particles. Specific examples of the organic particles include polymethyl methacrylate (PMMA) particles. The other abrasive grains may be used singly or in combination of two or more kinds thereof. As the other abrasive grains, commercially available products may be used or synthetic products may be used.

However, the content of the other abrasive grains is preferably 20% by mass or less, more preferably 10% by mass or less, still more preferably 5% by mass or less, and particularly preferably 1% by mass or less, based on the total mass of the abrasive grains. Most preferably, the content of the other abrasive grains is 0% by mass, that is, the abrasive grains are formed only of zirconia particles.

[Selectivity Improver]

The polishing composition of the present invention contains a selectivity improver. The selectivity improver can improve the ratio (selectivity, selection ratio) of the polishing speed for the material (b) to the polishing speed for the material (a).

Examples of the selectivity improver according to the present invention include, but are not particularly limited to, (1) a water-soluble polymer having a polar group, (2) a non-aromatic bridged cyclic compound having an organic acid group or a salt group thereof, and (3) an anionic surfactant. It is considered that these compounds (1) to (3) are adsorbed to the material (a) mainly by electrostatic attraction. Since the selectivity improver has a bulky structure, collision between the zirconia particles and the material (a) is suppressed, and the material (a) is strongly protected from the zirconia particles. Thus, the scraping action of the zirconia particles on the material (a) is weakened. Further, since the zirconia particles have a positive charge and the material (a) also has a positive charge, electrostatic repulsion acts therebetween, and the scraping action of the zirconia particles on the material (a) and the scraping frequency are weakened. In addition, it is considered that, by combining the zirconia particles and the selectivity improver, the functions of both are synergistically improved, the polishing suppressing effect of the zirconia particles on the material (a) is dramatically improved, and the selectivity is improved.

The above mechanism is based on presumption, and the present invention is not limited to the above mechanism.

Hereinafter, the selectivity improver according to the present invention will be described in more detail. The selectivity improver may be used singly or in combination of two or more kinds thereof. As the selectivity improver, commercially available products may be used or synthetic products may be used.

[(1) Water-Soluble Polymer Having Polar Group]

In the present invention, the selectivity improver preferably contains a water-soluble polymer having a polar group. Examples of the polar group include a hydroxy group, a carboxy group, an acid anhydride group, a sulfonic acid group, a phosphoric acid group, an amide group, a cyano group, a morpholino group, and a quaternary ammonium group. The water-soluble polymer may have one kind of polar group singly or two or more kinds of polar groups in combination. In the present specification, the term "water-soluble" means that the solubility in water (25° C.) is 1 g/100 mL or more, and the term "polymer" means a (co) polymer having a weight-average molecular weight of 1,000 or more.

Specific examples of the water-soluble polymer having a polar group include homopolymers such as polyvinyl alcohol, polyvinylpyrrolidone, poly(meth)acrylamide, polyvinylacetamide, and poly(meth)acryloylmorpholine; and copolymers such as a vinylpyrrolidone-vinyl alcohol copolymer, a vinylpyrrolidone-(meth)acrylamide copolymer, a vinylpyrrolidone-vinylacetamide copolymer, and a vinylpyrrolidone-(meth)acryloylmorpholine copolymer. The form of the copolymer may be any of a random copolymer, a block copolymer, an alternating copolymer, and a graft copolymer.

Further, functional group-modified water-soluble polymers obtained by further introducing a functional group such as a sulfonic acid group, a carboxylic acid group, or a quaternary ammonium group into polyvinyl alcohol, polyvinylpyrrolidone, or poly(meth)acrylamide can also be used. Such a functional group-modified water-soluble polymer can be synthesized by a conventionally known method.

The water-soluble polymer having a polar group may be used singly or in combination of two or more kinds thereof.

Among these, from the viewpoint of further improving the effects of the present invention, it is preferable to include at least one selected from the group consisting of polyvinyl alcohol, polyvinylpyrrolidone, and polyacrylamide, and it is more preferable to include polyvinylpyrrolidone.

The lower limit of the weight-average molecular weight (Mw) of the water-soluble polymer having a polar group is, but is not particularly limited to, preferably 1,000 or more, more preferably 2,000 or more, still more preferably 4,000 or more, yet still more preferably 6,000 or more, and particularly preferably 7,000 or more. Further, the upper limit of the weight-average molecular weight (Mw) of the water-soluble polymer having a polar group is, but is not particularly limited to, preferably 1,000,000 or less, more preferably 800,000 or less, still more preferably 600,000 or less, yet still more preferably 100,000 or less, and particularly preferably 30,000 or less. That is, the weight-average molecular weight (Mw) of the water-soluble polymer having a polar group is preferably 1,000 or more and 1,000,000 or less, more preferably 2,000 or more and 800,000 or less, still more preferably 4,000 or more and 600,000 or less, yet still more preferably 6,000 or more and 100,000 or less, and particularly preferably 7,000 or more and 30,000 or less.

In the present specification, a value obtained by gel permeation chromatography (GPC) in terms of polyethylene glycol is adopted as the weight-average molecular weight (Mw) of the water-soluble polymer having a polar group. More specifically, the weight-average molecular weight (Mw) of the water-soluble polymer having a polar group can be measured by the method described in Examples.

[(2) Non-Aromatic Bridged Cyclic Compound Having Organic Acid Group or Salt Group Thereof]

In the present invention, (2) a non-aromatic bridged cyclic compound having an organic acid group or a salt group thereof is preferably used as the selectivity improver.

In the present specification, the non-aromatic bridged cyclic compound refers to a bridged compound not having an aromatic ring in the molecule and having a structure in which both ends of linear structural portions of two or more substituents of one monocyclic structure are bonded, excluding those having a structure sharing one side (i.e., a condensed cyclic compound). Examples of the non-aromatic bridged cyclic compound include, but are not limited to, camphor, adamantane, and derivatives obtained by substituting a hydrocarbon group forming a ring in the molecular structure thereof with another atom or a functional group.

Preferred examples of the organic acid group or a salt group thereof include, but are not limited to, a carboxy group, a salt group of a carboxy group, a sulfo group, a salt group of a sulfo group, a phosphonic acid group, a salt group of a phosphonic acid group, a phosphoric acid group, and a salt group of a phosphoric acid group. That is, the non-aromatic bridged cyclic compound having an organic acid group or a salt group thereof preferably has at least one selected from the group consisting of a carboxy group, a salt group of a carboxy group, a sulfo group, a salt group of a sulfo group, a phosphonic acid group, a salt group of a phosphonic acid group, a phosphoric acid group, and a salt group of a phosphoric acid group. Further, among these, the non-aromatic bridged cyclic compound having an organic acid group or a salt group thereof more preferably has a carboxy group, a salt group of a carboxy group, a sulfo group, or a salt group of a sulfo group, still more preferably has a carboxy group or a sulfo group, and particularly preferably has a sulfo group. According to these groups, the polishing suppressing effect on the material (a) is further improved. Further, in the case of polishing an object to be polished containing the material (b) in addition to the material (a), the selectivity is further improved.

Examples of the non-aromatic bridged cyclic compound having an organic acid group or a salt group thereof are, but are not particularly limited to, preferably compounds represented by the following general formula 1 from the viewpoint of further improving the polishing suppressing effect on the material (a) and the viewpoint of a high polishing speed for the material (b).

[Formula 1]

(General Formula 1)

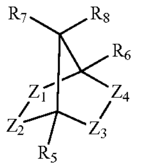

In the general formula 1, $Z_1$ is $CR_1R_1'$, C=O, or O;

$Z_2$ is $CR_2R_2'$, C=O, or O;

$Z_3$ is $CR_3R_3'$, C=O, or O;

$Z_4$ is $CR_4R_4'$, C=O, or O;

$R_1$, $R_1'$, $R_2$, $R_2'$, $R_3$, $R_3'$, $R_4$, $R_4'$, $R_5$, $R_6$, $R_7$, and $R_8$ are each independently a hydrogen atom, a deuterium atom, a halogen atom, a substituted or unsubstituted hydrocarbon group (e.g., a substituted or unsubstituted alkyl group, a substituted or unsubstituted alkenyl group, a substituted or unsubstituted alkynyl group), a substituted or unsubstituted alkoxy group, a substituted or unsubstituted polyoxyalkylene group, or an organic acid group or a salt group thereof;

when at least one of $R_1$, $R_1'$, $R_2$, $R_2'$, $R_3$, $R_{3'}$, $R_4$, $R_4'$, $R_5$, $R_6$, $R_7$, and $R_8$ is a substituted group, it is substituted with a substituent selected among a deuterium atom, a halogen atom, an unsubstituted hydrocarbon group (e.g., an unsubstituted alkyl group, an unsubstituted alkenyl group, or an unsubstituted alkynyl group), an unsubstituted alkoxy group, an unsubstituted polyoxyalkylene group, or an organic acid group or a salt group thereof; and at least one of $R_1$, $R_1'$, $R_2$, $R_2'$, $R_3$, $R_3'$, $R_4$, $R_4'$, $R_5$, $R_6$, $R_7$, and $R_8$ contains an organic acid group or a salt group thereof.

In the general formula 1, it is preferable that at least one of $Z_1$, $Z_2$, $Z_3$, and $Z_4$ is C═O, it is more preferable that at least one of $Z_1$ and $Z_3$ is C═O, it is still more preferable that either one of $Z_1$ and $Z_3$ is C═O, and it is particularly preferable that $Z_3$ is C═O. In this case, a group other than C═O in $Z_1$, $Z_2$, $Z_3$, and $Z_4$ is preferably CRR' (hereinafter, R represents $R_1$ to $R_4$ corresponding to $Z_1$ to $Z_4$, respectively, and R' represents $R_1'$ to $R_4'$ corresponding to $Z_1'$ to $Z_4'$, respectively) or O, and more preferably CRR'.

Examples of the halogen atom in $R_1$, $R_1'$, $R_2$, $R_2'$, $R_3$, $R_3'$, $R_4$, $R_4'$, $R_5$, $R_6$, $R_7$, and $R_8$ in the general formula 1 include, but are not limited to, F, Cl, Br, and I.

Examples of the hydrocarbon group in $R_1$, $R_1'$, $R_2$, $R_2'$, $R_3$, $R_3'$, $R_4$, $R_4'$, $R_5$, $R_6$, $R_7$, and $R_8$ in the general formula 1 include, but are not limited to, an alkyl group, an alkenyl group, or an alkynyl group. Among these, an alkyl group is preferable.

The alkyl group may be linear, branched, or cyclic. Examples of the alkyl group include, but are not limited to, an alkyl group having 1 to 12 carbon atoms. Among these, a linear or branched alkyl group having 1 to 5 carbon atoms is preferable, and specific examples thereof include a methyl group, an ethyl group, an n-propyl group, an isopropyl group, an n-butyl group, an isobutyl group, a sec-butyl group, a tert-butyl group, an n-pentyl group, an isopentyl group, a neopentyl group, and a 2-methylbutyl group. Among these, a linear alkyl group having 1 to 5 carbon atoms is preferable, a methyl group, an ethyl group, an n-propyl group, and an isopropyl group are more preferable, a methyl group or an ethyl group is still more preferable, and a methyl group is particularly preferable.

The alkenyl group may be linear, branched, or cyclic. Examples of the alkenyl group include, but are not limited to, a vinyl group, a 2-propenyl group, a 2-butenyl group, a 3-butenyl group, a 1-methyl-2-propenyl group, a 2-methyl-2-propenyl group, a 2-pentenyl group, a 3-pentenyl group, a 4-pentenyl group, a 1-methyl-2-butenyl group, a 2-methyl-2-butenyl group, a 3-methyl-2-butenyl group, a 1-methyl-3-butenyl group, a 2-methyl-3-butenyl group, a 3-methyl-3-butenyl group, a 1,1-dimethyl-2-propenyl group, a 1,2-dimethyl-2-propenyl group, and a 1-ethyl-2-propenyl group.

The alkynyl group may be linear, branched, or cyclic. Examples of the alkynyl group include, but are not limited to, a 2-butynyl group, a 3-pentynyl group, a hexynyl group, a heptynyl group, an octynyl group, and a decynyl group.

Examples of the alkoxy group in $R_1$, $R_1'$, $R_2$, $R_2'$, $R_3$, $R_3'$, $R_4$, $R_4'$, $R_5$, $R_6$, $R_7$, and $R_8$ in the general formula 1 include, but are not limited to, a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a neopentoxy group, a t-pentoxy group, and a 2-methylbutoxy group.

Examples of the polyoxyalkylene group in $R_1$, $R_1'$, $R_2$, $R_2'$, $R_3$, $R_3'$, $R_4$, $R_4'$, $R_5$, $R_6$, $R_7$, and $R_8$ in the general formula 1 include, but are not limited to, a polyoxyethylene group, a polyoxypropylene group, a polyoxybutylene group, a block polyoxyalkylene group of a polyoxyethylene group and a polyoxypropylene group, a random polyoxyalkylene group of a polyoxyethylene group and a polyoxypropylene group, a block polyoxyalkylene group of a polyoxyethylene group and a polyoxybutylene group, and a random polyoxyalkylene group of a polyoxyethylene group and a polyoxybutylene group.

The organic acid group or a salt group thereof in $R_1$, $R_1'$, $R_2$, $R_2'$, $R_3$, $R_3'$, $R_4$, $R_4'$, $R_5$, $R_6$, $R_7$, and $R_8$ in the general formula 1 is, but is not limited to, as above, preferably at least one selected from the group consisting of a carboxy group, a salt group of a carboxy group, a sulfo group, a salt group of a sulfo group, a phosphonic acid group, a salt group of a phosphonic acid group, a phosphoric acid group, and a salt group of a phosphoric acid group. Among these, a carboxy group, a salt group of a carboxy group, a sulfo group, or a salt group of a sulfo group is more preferable, a carboxy group or a sulfo group is still more preferable, and a sulfo group is particularly preferable.

In the general formula 1, in case where at least one of $R_1$, $R_1'$, $R_2$, $R_2'$, $R_3$, $R_3'$, $R_4$, $R_4'$, $R_5$, $R_6$, $R_7$, and $R_8$ is a substituted group, a halogen atom, a hydrocarbon group (e.g., an alkyl group, an alkenyl group, and an alkynyl group), an alkoxy group, a polyoxyalkylene group, an organic acid group or a salt group thereof as a substituent are the same as those described for these groups in $R_1$, $R_1'$, $R_2$, $R_2'$, $R_3$, $R_3'$, $R_4$, $R_4'$, $R_5$, $R_6$, $R_7$, and $R_8$ of the general formula 1, respectively.

In the general formula 1, in case where at least one of $R_1$, $R_1'$, $R_2$, $R_2'$, $R_3$, $R_3'$, $R_4$, $R_4'$, $R_5$, $R_6$, $R_7$, and R; is a substituted hydrocarbon group (e.g., a substituted alkyl group, a substituted alkenyl group, and a substituted alkynyl group), the substituent is preferably each independently a deuterium atom, a halogen atom, an unsubstituted alkoxy group, an unsubstituted polyoxyalkylene group, or an organic acid group or a salt group thereof. Further, in the general formula 1, in case where at least one of $R_1$, $R_1'$, $R_2$, $R_2'$, $R_3$, $R_3'$, $R_4$, $R_4'$, $R_5$, $R_6$, $R_7$, and $R_8$ is a substituted alkoxy group, or a substituted polyoxyalkylene group, the substituent is preferably each independently a deuterium atom, a halogen atom, an unsubstituted alkenyl group, an unsubstituted alkynyl group, an unsubstituted alkoxy group, an unsubstituted polyoxyalkylene group, or an organic acid group or a salt group thereof.

In the general formula 1, at least one of $R_1$, $R_1'$, $R_2$, $R_2'$, $R_3$, $R_3'$, $R_4$, $R_4'$, $R_5$, $R_6$, $R_7$, and $R_8$ is preferably an organic acid group or a salt group thereof or an alkyl group substituted with an organic acid group or a salt group thereof. Among these, it is more preferable that only one of $R_1$, $R_1'$, $R_2$, $R_2'$, $R_3$, $R_3'$, $R_4$, $R_4'$, $R_5$, $R_6$, $R_7$, and $R_8$ is an organic acid group or a salt group thereof or an alkyl group substituted with an organic acid group or a salt group thereof. In this case, the organic acid group or a salt group thereof or the alkyl group substituted with an organic acid group or a salt group thereof is still more preferably a carboxy group or a salt group thereof, a sulfo group or a salt group thereof, a methyl group substituted with a carboxy group or a salt group thereof, or a methyl group substituted with a sulfo group or a salt group thereof, particularly preferably a carboxy group or a methyl group substituted with a sulfo group, and most preferably a methyl group substituted with a sulfo group. According to these groups, the polishing suppressing effect on the material (a) is further improved. Further, in the case of polishing an object to be polished containing another material (particularly the material (b)) in addition to the material (a), the selectivity of the material (b) to the material (a) is further improved.

In the general formula 1, it is particularly preferable that $R_1$, $R_1'$, $R_2$, $R_2'$, $R_3$, $R_3'$, $R_4$, and $R_4'$ is each independently a hydrogen atom.

In the general formula 1, $R_5$ is preferably a hydrogen atom or a substituted or unsubstituted alkyl group, more preferably a substituted or unsubstituted alkyl group, still more preferably a substituted alkyl group, and particularly preferably an alkyl group substituted with an organic acid group or a salt group thereof. In this case, the alkyl group substituted with an organic acid group or a salt group thereof is preferably a methyl group substituted with a sulfo group or a salt group thereof, and particularly preferably a methyl group substituted with a sulfo group.

In the general formula 1, $R_6$, is preferably a hydrogen atom or an organic acid group or a salt group thereof, more preferably a hydrogen atom or a carboxy group or a salt group thereof, still more preferably a hydrogen atom or a carboxy group, and particularly preferably a hydrogen atom.

In the general formula 1, $R_7$ and $R_8$ are preferably each independently a substituted or unsubstituted alkyl group, more preferably an unsubstituted alkyl group, and particularly preferably a methyl group.

The non-aromatic bridged cyclic compound having an organic acid group or a salt group thereof may be used singly or in combination of two or more kinds thereof.

Preferred specific examples of the non-aromatic bridged cyclic compound having an organic acid group or a salt group thereof include 10-camphorsulfonic acid, camphanic acid, and ketopinic acid. Among these, 10-camphorsulfonic acid or camphanic acid is preferable, and 10-camphorsulfonic acid is more preferable. The 10-camphorsulfonic acid may be any one stereoisomer, any mixture of stereoisomers, or a racemate.

From the viewpoint of further improving the effect of the present invention, it is more preferable that the selectivity improver contains both (1) the water-soluble polymer having a polar group and (2) the non-aromatic bridged cyclic compound having an organic acid group or a salt group thereof.

[(3) Anionic Surfactant]

In the present invention, (3) an anionic surfactant can be used as the selectivity improver. As the selectivity improver, only (3) the anionic surfactant may be used, but it is preferable to use (3) the anionic surfactant in combination with the compound of (1) and/or (2), and it is more preferable to use (2) the non-aromatic bridged cyclic compound having an organic acid group or a salt group thereof in combination with (3) the anionic surfactant. With such a combination, the effect of the present invention is further improved. The anionic surfactant is a surfactant having an anionic hydrophilic group, and a carboxylic acid-type, a sulfonic acid-type, a sulfuric acid ester-type, a phosphoric acid ester-type or the like can be used without particular limitation.

The carboxylic acid-type anionic surfactant is preferably a salt of a carboxy group having, as a main chain, a linear or branched hydrocarbon group or acyl group having 1 to 22 carbon atoms, a polyoxyalkylene group, an aromatic group, or a combination thereof and a metal such as an alkali metal or a Group 2 metal. Further, the hydrocarbon group may be linear or branched with 1 to 18 carbon atoms, and may be saturated or unsaturated. More specifically, for example, sodium laurate, sodium stearate, sodium laureth-6 carboxylate (sodium polyoxyethylene (4.5) lauryl ether acetate), sodium lauroyl sarcosinate, sodium octanoate, sodium decanoate, sodium myristate, sodium palmitate, sodium sarcosinate of coconut oil fatty acids (C8 to 18), potassium coconut fatty acids, and the like can be used.

The sulfonic acid-type anionic surfactant is preferably a salt of a sulfonyl group having, as a main chain, a linear or branched hydrocarbon group or acyl group having 1 to 22 carbon atoms, a polyoxyalkylene group, an aromatic group, or a combination thereof and a metal such as an alkali metal or a Group 2 metal. Further, the hydrocarbon group may be linear or branched with 1 to 18 carbon atoms, and may be saturated or unsaturated. Specifically, sodium lauryl sulfoacetate, sodium 1-propanesulfonate, sodium 1-butanesulfonate, sodium 1-pentanesulfonate, sodium 1-hexanesulfonate, sodium 1-heptanesulfonate, sodium 1-octanesulfonate, sodium 1-decanesulfonate, sodium 1-dodecanesulfonate, sodium toluenesulfonate, sodium cumenesulfonate, sodium naphthalenesulfonate, disodium naphthalenedisulfonate, trisodium naphthalenetrisulfonate, sodium alpha-olefinsulfonate, sodium dodecylbenzenesulfonate, and the like can be used.

The sulfuric acid ester-type anionic surfactant is preferably a salt of a sulfuric acid group having, as a main chain, a linear or branched hydrocarbon group or acyl group having 1 to 22 carbon atoms, a polyoxyalkylene group, an aromatic group, or a combination thereof and a metal such as an alkali metal or a Group 2 metal. Further, the hydrocarbon group may be linear or branched with 1 to 18 carbon atoms, and may be saturated or unsaturated. Specifically, sodium lauryl sulfate, sodium myristyl sulfate, sodium laureth sulfate (sodium polyoxyethylene lauryl ether sulfate), sodium cetyl sulfate, sodium cocoglyceryl sulfate (sodium hydrogenated coconut oil fatty acid glyceryl sulfate), triethanolamine lauryl sulfate, ammonium lauryl sulfate, triethanolamine laureth sulfate, and the like can be used.

The phosphoric acid ester-type anionic surfactant is preferably a salt of a phosphoric acid group having, as a main chain, a linear or branched hydrocarbon group or acyl group having 1 to 22 carbon atoms, a polyoxyalkylene group, an aromatic group, or a combination thereof and a metal such as an alkali metal or a Group 2 metal. Further, the hydrocarbon group may be linear or branched with 1 to 18 carbon atoms, and may be saturated or unsaturated. Specifically, sodium lauryl phosphate, sodium polyoxyethylene cetyl ether phosphate (sodium polyoxyethylene (5) cetyl ether phosphate), lauryl phosphate, potassium lauryl phosphate, and the like can be used.

The anionic surfactant may be used singly or in combination of two or more kinds thereof.

Among these anionic surfactants, at least one selected from the group consisting of sodium 1-propanesulfonate, sodium 1-butanesulfonate, sodium 1-pentanesulfonate, sodium 1-hexanesulfonate, sodium 1-heptanesulfonate, sodium 1-octanesulfonate, and ammonium lauryl sulfate is more preferable, and at least one selected from the group consisting of sodium 1-pentanesulfonate, sodium 1-hexanesulfonate, sodium 1-heptanesulfonate, and sodium 1-octanesulfonate is still more preferable.

The weight-average molecular weight of these anionic surfactants is less than 1,000, preferably 500 or less, still more preferably 250 or less, and more preferably 200 or less.

The content (concentration) of the selectivity improver is not particularly limited and can be appropriately selected depending on the type of the selectivity improver. For example, in a case where (1) the water-soluble polymer having a polar group is used as the selectivity improver, the content thereof is preferably 0.00001% by mass or more, more preferably 0.00005% by mass or more, and still more preferably 0.0001% by mass or more, based on the total mass of the polishing composition. Within this range, the polishing suppressing effect on the material (a) is further improved. Further, in the case of polishing an object to be polished containing the material (b) in addition to the material (a), the selectivity of the material (b) to the material (a) is further improved. The content (concentration) of (1) the water-soluble polymer having a polar group is preferably 1% by mass or less, more preferably 0.5% by mass or less, and still more preferably 0.1% by mass or less, based on the total mass of the polishing composition. Within this range, the effect as a selectivity improver becomes higher. That is, the content of (1) the water-soluble polymer having a polar group is preferably 0.00001% by mass or more and 1, by mass or less, more preferably 0.00005% by mass or more and 0.5, by mass or less, and still more preferably 0.0001% by mass or more and 0.1% by mass or less, based on the total mass of the polishing composition. In a case where the polishing composition contains two or more water-soluble polymers having a polar group, the above content is intended to be the total amount of these.

In a case where (2) the non-aromatic bridged cyclic compound having an organic acid group or a salt group thereof is used as the selectivity improver, the content thereof is preferably 0.001% by mass or more, more preferably 0.005% by mass or more, and still more preferably 0.01% by mass or more, based on the total mass of the polishing composition. Within this range, the polishing suppressing effect on the material (a) is further improved. Further, in the case of polishing an object to be polished containing the material (b) in addition to the material (a), the selectivity of the material (b) to the material (a) is further improved. The content (concentration) of (2) the non-aromatic bridged cyclic compound having an organic acid group or a salt group thereof is preferably 10% by mass or less, more preferably 5% by mass or less, still more preferably 1% by mass or less, yet still more preferably 0.5% by mass or less, particularly preferably 0.3% by mass or less, and most preferably less than 0.1% by mass, based on the total mass of the polishing composition. Within this range, the effect as a selectivity improver becomes higher. The reason for this is presumed to be that the electrostatic repulsion between the zirconia particles and the material (a) is better maintained because the electrical conductivity is not excessively increased and the electric double layer of the zirconia particles and the material (a) is not excessively compressed. Further, within this range, better dispersion stability of the slurry is also ensured. That is, the content of (2) the non-aromatic bridged cyclic compound having an organic acid group or a salt group thereof is preferably 0.001% by mass or more and 10% by mass or less, more preferably 0.005% by mass or more and 5% by mass or less, still more preferably 0.01% by mass or more and 1% by mass or less, yet still more preferably 0.01% by mass or more and 0.5% by mass or less, particularly preferably 0.01% by mass or more and 0.3% by mass or less, and most preferably 0.01% by mass or more and less than 0.1% by mass, based on the total mass of the polishing composition. In a case where the polishing composition contains two or more non-aromatic bridged cyclic compounds having an organic acid group or a salt group thereof, the above content is intended to be the total amount of these.

In a case where (3) the anionic surfactant is used as the selectivity improver, the content thereof is preferably 0.0001, by mass or more, more preferably 0.0005% by mass or more, and still more preferably 0.001% by mass or more, based on the total mass of the polishing composition. Within this range, the polishing suppressing effect on the material (a) is further improved. Further, in the case of polishing an object to be polished containing the material (b) in addition to the material (a), the selectivity of the material (b) to the material (a) is further improved. The content (concentration) of (3) the anionic surfactant is preferably 1% by mass or less, more preferably 0.5% by mass or less, still more preferably 0.11 by mass or less, and particularly preferably 0.05% by mass or less, based on the total mass of the polishing composition. Within this range, the effect as a selectivity improver becomes higher. That is, the content of (3) the anionic surfactant is preferably 0.0001% by mass or more and 1, by mass or less, more preferably 0.0005% by mass or more and 0.5% by mass or less, still more preferably 0.001% by mass or more and 0.1% by mass or less, and particularly preferably 0.001% by mass or more and 0.05% by mass or less, based on the total mass of the polishing composition. In a case where the polishing composition contains two or more anionic surfactants, the above content is intended to be the total amount of these.

Further, the content (concentration) of the selectivity improver may be appropriately selected in an amount such that the desired pH value of the polishing composition is obtained. In this case, it is preferable to add such an amount that the pH value of the polishing composition described later is obtained. In a case where such a content (concentration) is adopted, a pH adjusting agent described later may or may not be used.

[Dispersing Medium]

The polishing composition of the present invention contains a dispersing medium for dispersing each component. Examples of the dispersing medium include water; alcohols such as methanol, ethanol, and ethylene glycol; ketones such as acetone; and mixtures thereof. Of these, water is preferable as the dispersing medium. That is, according to a preferred embodiment of the present invention, the dispersing medium contains water. According to a more preferred embodiment of the present invention, the dispersing medium consists substantially of water. The term "substantially" is intended to be capable of including a dispersing medium other than water as long as the object and effects of the present invention can be achieved, and more specifically, the dispersing medium is preferably composed of 90% by mass or more and 100% by mass or less of water and 0% by mass or more and 10% by mass or less of a dispersing medium other than water, and more preferably composed of 99% by mass or more and 100% by mass or less of water and 0% by mass or more and 1% by mass or less of a dispersing medium other than water. Most preferably, the dispersing medium is water.

From the viewpoint of not inhibiting the action of the components contained in the polishing composition, as the dispersing medium, water containing as little impurities as possible is preferable, and specifically, pure water or ultrapure water obtained by removing impurity ions with an ion exchange resin and then removing foreign substances through a filter, or distilled water is more preferable.

[pH and pH Adjusting Agent]

The pH of the polishing composition according to the present invention is less than 7. In a case where the pH is 7 or more, the polishing speed for the organic material (b) and the selectivity thereof decrease.

The pH is preferably 6.5 or less, more preferably 6 or less. Further, the lower limit of the pH is preferably 1 or more, more preferably 2 or more, and still more preferably 2.5 or more. That is, the pH of the polishing composition according to the present invention is preferably 1 or more and 6.5 or less, more preferably 2 or more and 6 or less, and still more preferably 2.5 or more and 6 or less.

As described above, the selectivity improver according to the present invention may have a role as a pH adjusting agent. Therefore, the polishing composition according to the present invention may not contain a pH adjusting agent for adjusting the pH. However, in a case where the desired pH cannot be obtained only by the addition of the selectivity improver, the polishing composition of the present invention may contain a pH adjusting agent other than the selectivity improver. The pH adjusting agent may be any of an inorganic acid, an organic acid, and a base. The pH adjusting agent can be used singly or in combination of two or more kinds thereof.

Specific examples of the inorganic acid that can be used as the pH adjusting agent include hydrochloric acid, sulfuric acid, nitric acid, hydrofluoric acid, boric acid, carbonic acid, hypophosphorous acid, phosphorous acid, and phosphoric acid. Among them, hydrochloric acid, sulfuric acid, nitric acid or phosphoric acid is preferable.

Specific examples of the organic acid that can be used as the pH adjusting agent include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, phenoxyacetic acid, methanesulfonic acid, ethanesulfonic acid, and isethionic acid.

Instead of the inorganic acid or organic acid, or in combination with the inorganic acid or organic acid, a salt such as an alkali metal salt of the inorganic acid or organic acid may be used as the pH adjusting agent. In the case of a combination of a weak acid and a strong base, a strong acid and a weak base, or a weak acid and a weak base, a pH buffering action can be expected.

Specific examples of the base that can be used as the pH adjusting agent include ammonia, sodium hydroxide, potassium hydroxide, and tetramethylarmonium hydroxide. The amount of the pH adjusting agent added is not particularly limited, and may be appropriately adjusted so that the polishing composition has a desired pH.

The pH of the polishing composition can be measured, for example, with a pH meter, specifically by the method described in Examples.

[Other Components]

The polishing composition according to the present invention may further contain known additives that can be used in a polishing composition, such as an oxidizing agent, a complexing agent, an antiseptic agent, and an antifungal agent, as long as the effects of the present invention are not impaired. Among these, it is preferable to contain an oxidizing agent.

The oxidizing agent has an action of oxidizing the surface of the object to be polished, and can further improve the polishing speed for the object to be polished by the polishing composition.

Examples of the oxidizing agent include hydrogen peroxide, sodium peroxide, barium peroxide, ozone water, silver (II) salts, iron (III) salts, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and salts thereof. These oxidizing agents can be used singly or in combination of two or more kinds thereof. Among these, hydrogen peroxide, potassium permanganate, sodium permanganate, ammonium persulfate, periodic acid, hypochlorous acid, and sodium dichloroisocyanurate are preferable, hydrogen peroxide, potassium permanganate, and sodium permanganate are more preferable, and potassium permanganate is still more preferable.

The lower limit of the content of the oxidizing agent in the polishing composition is preferably 0.001% by mass or more, and more preferably 0.01% by mass or more. By setting the lower limit in this way, the polishing speed can be further improved. Further, the upper limit of the content of the oxidizing agent in the polishing composition is preferably 30% by mass or less, more preferably 10% by mass or less, and still more preferably 1% by mass or less. By setting the upper limit in this way, the material cost of the polishing composition can be suppressed, and in addition, the load of treatment of the polishing composition after polishing use, that is, waste water treatment, can be reduced. Further, the possibility of excessive oxidation of the surface of the object to be polished by the oxidizing agent can be reduced.

[Method for Producing Polishing Composition]

A method for producing the polishing composition according to the present invention is not particularly limited, and the polishing composition can be obtained, for example, by stirring and mixing zirconia particles, a selectivity improver, and, as necessary, other additives in a dispersing medium (preferably in water). The details of each component are as described above.

The temperature at which each component is mixed is, but is not particularly limited to, preferably 10° C. or more and 40° C. or less, and may be heated in order to increase the rate of dissolution. Further, the mixing time is not particularly limited as long as uniform mixing is possible.

[Polishing Method and Method for Producing Semiconductor Substrate]

As described above, the polishing composition according to the present invention is suitably used for polishing an object to be polished having the material (a) having a metal-nitrogen bond and the organic material (b). Therefore, the present invention provides a polishing method for polishing an object to be polished containing the material (a) having a metal-nitrogen bond and the organic material (b) with the polishing composition according to the present invention. The present invention also provides a method for producing a semiconductor substrate, which comprises polishing a semiconductor substrate comprising the material (a) having a metal-nitrogen bond and the organic material (b) by the above polishing method.

As the polishing apparatus, it is possible to use a general polishing apparatus provided with a holder for holding a substrate or the like having an object to be polished, a motor or the like capable of changing the number of rotations, and having a platen to which a polishing pad (polishing cloth) can be attached.

As the polishing pad, a general nonwoven fabric, polyurethane, porous fluororesin, or the like can be used without particular limitation. It is preferable that the polishing pad is grooved so that the polishing liquid may accumulate.

Regarding the polishing conditions, for example, the rotation speed of the platen and the carriers is preferably 10 rpm ($0.17$ s$^{-1}$) or more and 500 rpm ($8.33$ s$^{-1}$) or less. The pressures applied to the substrate having an object to be polished (polishing pressures) are preferably 0.5 psi (3.4 kPa) or more and 10 psi (68.9 kPa) or less.

A method of supplying the polishing composition to the polishing pad is also not particularly limited, and for example, a method of continuously supplying the polishing composition with a pump or the like is adopted. Although the supply amount is not limited, it is preferable that the surface of the polishing pad is always covered with the polishing composition according to the present invention.

After completion of the polishing, the substrate is washed in running water, and water droplets adhering on the substrate are shaken off by a spin dryer or the like to dry the substrate, thereby obtaining a substrate having a metal-containing layer.

The polishing composition according to the present invention may be a one pack type or a multi-pack type including a two pack type. The polishing composition according to the present invention may be prepared by diluting a stock solution of the polishing composition by, for example, 10 times or more using a diluent such as water.

Although embodiments of the present invention have been described in detail, it is to be clearly understood that this is illustrative and exemplary, not limiting, and that the scope of the invention is to be construed in accordance with the appended claims.

The present invention encompasses the following aspects and embodiments.

1. A polishing composition comprising:

zirconia particles; and a selectivity improver for improving a ratio of a polishing speed for an organic material (b) to a polishing speed for a material (a) having a metal-nitrogen bond; and a dispersing medium, wherein in a particle size distribution of the zirconia particles obtained by a laser diffraction/scattering method, a diameter (D50) of the particles when a cumulative volume of the particles from a fine particle side reaches 50, of a total volume of the particles is 5 nm or more and 150 nm or less, and a pH of the polishing composition is less than 7.

2. The polishing composition according to 1. above, wherein the selectivity improver contains a water-soluble polymer having a polar group.

3. The polishing composition according to 2. above, wherein the water-soluble polymer having a polar group contains at least one selected from the group consisting of polyvinyl alcohol, polyvinylpyrrolidone, and polyacrylamide.

4. The polishing composition according to any one of 1. to 3. above, wherein the selectivity improver contains a non-aromatic bridged cyclic compound having an organic acid group or a salt group thereof.

5. The polishing composition according to 4. above, wherein the non-aromatic bridged cyclic compound having an organic acid group or a salt group thereof is a compound represented by the following general formula 1:

[Formula 2]

(General Formula 1)

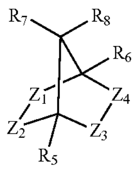

wherein:

$Z_1$ is $CR_1R_1'$, C═O, or O;

$Z_2$ is $CR_2R_2'$, C═O, or O;

$Z_3$ is $CR_3R_3'$, C═O, or O;

$Z_4$ is $CR_4R_4'$, C═O, or O;

$R_1$, $R_1'$, $R_2$, $R_2'$, $R_3$, $R_3'$, $R_4$, $R_4'$, $R_5$, $R_6$, $R_7$, and $R_8$ are each independently a hydrogen atom, a deuterium atom, a halogen atom, a substituted or unsubstituted alkyl group, a substituted or unsubstituted alkenyl group, a substituted or unsubstituted alkynyl group, a substituted or unsubstituted alkoxy group, a substituted or unsubstituted polyoxyalkylene group, or an organic acid group or a salt group thereof;

when at least one of $R_1$, $R_1'$, $R_2$, $R_2'$, $R_3$, $R_3'$, $R_4$, $R_4'$, $R_5$, $R_6$, $R_7$, and $R_8$ is a substituted group, it is substituted with a substituent selected among a deuterium atom, a halogen atom, an unsubstituted alkyl group, an unsubstituted alkenyl group, an unsubstituted alkynyl group, an unsubstituted alkoxy group, an unsubstituted polyoxyalkylene group, or an organic acid group or a salt group thereof; and at least one of $R_1$, $R_1'$, $R_2$, $R_2'$, $R_3$, $R_3'$, $R_4$, $R_4'$, $R_5$, $R_6$, $R_7$, and $R_8$ contains an organic acid group or a salt group thereof.

6. The polishing composition according to 5. above, wherein the compound represented by general formula 1 is 10-camphorsulfonic acid.

7. The polishing composition according to any one of 2. to 6. above, wherein the selectivity improver further contains an anionic surfactant.

8. The polishing composition according to any one of 1. to 7. above, which is used for polishing an object to be polished comprising the material (a) having a metal-nitrogen bond and the organic material (b).

9. A polishing method comprising a step of polishing an object to be polished comprising the material (a) having a metal-nitrogen bond and the organic material (b) using the polishing composition according to any one of 1. to 8. above.

10. A method for producing a semiconductor substrate, comprising a step of polishing a semiconductor substrate comprising the material (a) having a metal-nitrogen bond and the organic material (b) by the polishing method according to 9. above.

EXAMPLES

The present invention will be described in more detail with reference to the following Examples and Comparative Examples. However, the technical scope of the present invention is not limited to the following examples. Unless otherwise specified, "%" and "part" mean "% by mass" and "parts by mass", respectively.

[Measurement Method of Various Physical Properties]

In the Examples, various physical properties were measured by the following methods.

<Measurement of Particle Size>

As the value of D50 of the zirconia particles, a value measured as a volume-average particle size by a dynamic light scattering method using a particle size distribution measuring apparatus (UPA UT151, manufactured by Nikkiso Co., Ltd.) was adopted.

The particle size of the zirconia particles was measured using a dispersion obtained by dispersing the zirconia particles in water. In the particle size distribution of the zirconia particles, the diameter D50 of the particles when the cumulative volume of the particles from a fine particle side reaches 50% of the total volume of the particles were calculated by analysis with the measuring instrument.

<Measurement of Zeta Potential>

The zeta potential of the zirconia particles was measured using a zeta potential measuring apparatus (trade name "ELS-Z") manufactured by Otsuka Electronics Co., Ltd.

<Measurement of pH>

The pH of the polishing composition was measured with a pH meter (manufactured by HORIBA, Ltd., model number: F-71).

<Weight-Average Molecular Weight (Mw)>

The molecular weight of the water-soluble polymer having a polar group was determined using a value of a weight-average molecular weight (in terms of polyethylene glycol) measured by gel permeation chromatography (GPC), and more specifically, was measured by the following apparatus and conditions:

GPC apparatus: manufactured by Shimadzu Corporation
Model: Prominence+ELSD detector (ELSD-LTII)
Column: VP-ODS (manufactured by Shimadzu Corporation)
Mobile phase A: MeOH
B: 1% aqueous acetic acid solution
Flow rate: 1 mL/min
Detector: ELSD temp. 40° C., Gain 8, $N_2$ GAS 350 kPa
Oven temperature: 40° C.
Injection volume: 40 μL.

[Preparation of Polishing Composition]

Example 1

Colloidal zirconia (manufactured by DAIICHI KIGENSO KAGAKU KOGYO CO., LTD., NYACOL (Registered trademark) ZR70/20, concentration of zirconia particles: 20% by mass, D50 of zirconia particles: 70 nm) was prepared as abrasive grains. Further, 10-camphorsulfonic acid (manufactured by FUJIFILM Wako Pure Chemical Corporation, Ltd.) was prepared as a selectivity improver.

Colloidal zirconia and 10-camphorsulfonic acid were added to pure water as a dispersing medium at room temperature (25° C.) so as to have a final concentration of 0.1% by mass and a final concentration of 0.05 by mass, respectively, to obtain a liquid mixture. The obtained liquid mixture was stirred and mixed at room temperature (25° C.) for 30 minutes to prepare a polishing composition. The pH of the obtained polishing composition was 3.7, and the zeta potential of the colloidal zirconia in the obtained polishing composition was 40 mV. Further, the particle size of the colloidal zirconia in the polishing composition was the same as that of the colloidal zirconia described above.

Example 2

A polishing composition was prepared in the same manner as in Example 1 except that colloidal zirconia was added to pure water so as to have a final concentration of 0.5 by mass.

Example 3

A polishing composition was prepared in the same manner as in Example 1 except that colloidal zirconia was added to pure water so as to have a final concentration of 2.0% by mass.

Example 4

A polishing composition was prepared in the same manner as in Example 2 except that polyvinylpyrrolidone (PVP, manufactured by Kanto Chemical Co., Inc., weight-average molecular weight: 8,000) was further added so as to have a final concentration of 0.0001% by mass.

Example 5

A polishing composition was prepared in the same manner as in Example 4 except that the concentration of polyvinylpyrrolidone was changed to 0.0003% by mass.

Example 6

A polishing composition was prepared in the same manner as in Example 4 except that polyvinylpyrrolidone having a weight-average molecular weight of 40,000 (manufactured by DKS Co. Ltd.) was used instead of polyvinylpyrrolidone having a weight-average molecular weight of 8,000.

Example 7

A polishing composition was prepared in the same manner as in Example 4 except that polyvinyl alcohol having a weight-average molecular weight of 10,000 (PVA, manufactured by Japan Vam & Poval Co., Ltd.) was used instead of polyvinylpyrrolidone having a weight-average molecular weight of 8,000.

Example 8

A polishing composition was prepared in the same manner as in Example 7 except that the concentration of polyvinyl alcohol was changed to 0.0003% by mass.

Example 9

A polishing composition was prepared in the same manner as in Example 4 except that polyvinyl alcohol having a weight-average molecular weight of 40,000 (manufactured by Japan Vam & Poval Co., Ltd.) was used instead of polyvinylpyrrolidone having a weight-average molecular weight of 8,000.

Example 10

A polishing composition was prepared in the same manner as in Example 4 except that the concentration of 10-camphorsulfonic acid was changed to 0.1% by mass. The pH of the obtained polishing composition was 3.0. Further, the zeta potential of the colloidal zirconia in the obtained polishing composition was 45 mV.

Example 11

A polishing composition was prepared in the same manner as in Example 4 except that the concentration of 10-camphorsulfonic acid was changed to 0.01% by mass. The pH of the obtained polishing composition was 5.5. Further, the zeta potential of the colloidal zirconia in the obtained polishing composition was 38 mV.

Example 12

A polishing composition was prepared in the same manner as in Example 2 except that colloidal zirconia having a D50 of 100 nm was used. The zeta potential of the colloidal zirconia in the obtained polishing composition was 35 mV.

Example 13

A polishing composition was prepared in the same manner as in Example 5 except that nitric acid as a pH adjusting agent was used at a concentration of 0.05% by mass instead of 10-camphorsulfonic acid.

Example 14

A polishing composition was prepared in the same manner as in Example 13 except that sodium 1-hexanesulfonate (manufactured by Tokyo Chemical Industry Co., Ltd.) was further added so as to have a final concentration of 0.01% by mass.

Example 15

A polishing composition was prepared in the same manner as in Example 13 except that polyvinyl alcohol having a weight-average molecular weight of 10,000 (manufactured by Japan Vam & Poval Co., Ltd.) was used instead of polyvinylpyrrolidone having a weight-average molecular weight of 8,000.

Example 16

A polishing composition was prepared in the same manner as in Example 13 except that polyacrylamide having a weight-average molecular weight of 10,000 (manufactured by Merck) was used at a concentration of 0.05% by mass instead of polyvinylpyrrolidone having a weight-average molecular weight of 8,000.

Example 17

A polishing composition was prepared in the same manner as in Example 16 except that 10-camphorsulfonic acid was used instead of nitric acid and the concentration of polyacrylamide was 0.01% by mass.

Example 18

A polishing composition was prepared in the same manner as in Example 17, except that the concentration of polyacrylamide was 0.05% by mass.

Example 19

A polishing composition was prepared in the same manner as in Example 17 except that polyacrylamide having a weight-average molecular weight of 400,000 (manufactured by FUJIFILM Wako Pure Chemical Corporation, Ltd.) was used instead of polyacrylamide having a weight-average molecular weight of 10,000.

Example 20

A polishing composition was prepared in the same manner as in Example 4 except that ammonium lauryl sulfate (manufactured by Kao Corporation) was used at a concentration of 0.005% by mass instead of polyvinylpyrrolidone having a weight-average molecular weight of 8,000.

Example 21

A polishing composition was prepared in the same manner as in Example 4 except that sodium 1-hexanesulfonate (manufactured by Tokyo Chemical Industry Co., Ltd.) was used at a concentration of 0.011 by mass instead of polyvinylpyrrolidone having a weight-average molecular weight of 8,000.

Example 22

A polishing composition was prepared in the same manner as in Example 21 except that the concentration of sodium 1-hexanesulfonate was changed to 0.005% by mass.

Comparative Example 1

A polishing composition was prepared in the same manner as in Example 2 except that the concentration of 10-camphorsulfonic acid was changed to 0.0001% by mass. The pH of the obtained polishing composition was 7.0. Further, the zeta potential of the colloidal zirconia in the obtained polishing composition was 40 mV.

Comparative Example 2

A polishing composition was prepared in the same manner as in Example 13 except that polyvinylpyrrolidone having a weight-average molecular weight of 8,000 was not used.

Comparative Example 3

A polishing composition was prepared in the same manner as in Comparative Example 2 except that colloidal zirconia having a D50 of 250 nm was used. The zeta potential of the colloidal zirconia in the obtained polishing composition was 35 mV.

Comparative Example 4

<Preparation of Abrasive Grains>

In the same manner as described in Example 1 of JP 2005-162533 A, a cocoon-shaped cation-modified colloidal silica having a D50 of 70 nm was prepared by applying γ-aminopropyltriethoxysilane as a silane-coupling agent at a concentration of 2 mmol to 1 L of a methanol solution (silica concentration: 20%, by mass) of silica sol.

A polishing composition was prepared in the same manner as in Example 3 except that the cation-modified colloidal silica obtained above was used at a concentration of 2.0% by mass instead of colloidal zirconia, and nitric acid was used as a pH adjusting agent. The pH of the obtained polishing composition was 3.7. Further, the zeta potential of the cation-modified colloidal silica in the obtained polishing composition was 40 mV.

Comparative Example 5

A polishing composition was prepared in the same manner as in Comparative Example 4 except that 10-camphorsulfonic acid was not used.

The constituents of the polishing compositions of Examples and Comparative Examples are shown in Table 1 below. In addition, “-” in Table 1 below indicates that the agent was not used.

TABLE 1

| | Abrasive grains | | | | Selectivity improver (1) | | |
|---|---|---|---|---|---|---|---|
| | type | concentration (% by mass) | D50 (nm) | zeta potential (mV) | type | molecular weight | concentration (% by mass) |
| Example 1 | colloidal zirconia | 0.1 | 70 | 40 | — | — | |
| Example 2 | colloidal zirconia | 0.5 | 70 | 40 | — | — | |
| Example 3 | colloidal zirconia | 2.0 | 70 | 40 | — | — | |
| Example 4 | colloidal zirconia | 0.5 | 70 | 40 | PVP | 8000 | 0.0001 |
| Example 5 | colloidal zirconia | 0.5 | 70 | 40 | PVP | 8000 | 0.0003 |
| Example 6 | colloidal zirconia | 0.5 | 70 | 40 | PVP | 40000 | 0.0001 |
| Example 7 | colloidal zirconia | 0.5 | 70 | 40 | PVA | 10000 | 0.0001 |
| Example 8 | colloidal zirconia | 0.5 | 70 | 40 | PVA | 10000 | 0.0003 |
| Example 9 | colloidal zirconia | 0.5 | 70 | 40 | PVA | 40000 | 0.0001 |
| Example 10 | colloidal zirconia | 0.5 | 70 | 45 | PVP | 8000 | 0.0001 |
| Example 11 | colloidal zirconia | 0.5 | 70 | 38 | PVP | 8000 | 0.0001 |
| Example 12 | colloidal zirconia | 0.5 | 100 | 35 | — | — | — |
| Example 13 | colloidal zirconia | 0.5 | 70 | 40 | PVP | 8000 | 0.0003 |
| Example 14 | colloidal zirconia | 0.5 | 70 | 40 | PVP | 8000 | 0.0003 |
| Example 15 | colloidal zirconia | 0.5 | 70 | 40 | PVA | 10000 | 0.0003 |
| Example 16 | colloidal zirconia | 0.5 | 70 | 40 | polyacrylamide | 10000 | 0.05 |
| Example 17 | colloidal zirconia | 0.5 | 70 | 40 | polyacrylamide | 10000 | 0.01 |
| Example 18 | colloidal zirconia | 0.5 | 70 | 40 | polyacrylamide | 10000 | 0.05 |
| Example 19 | colloidal zirconia | 0.5 | 70 | 40 | polyacrylamide | 400000 | 0.01 |
| Example 20 | colloidal zirconia | 0.5 | 70 | 40 | — | — | — |
| Example 21 | colloidal zirconia | 0.5 | 70 | 40 | — | — | — |
| Example 22 | colloidal zirconia | 0.5 | 70 | 40 | — | — | — |
| Comparative Example 1 | colloidal zirconia | 0.5 | 70 | 40 | — | — | — |
| Comparative Example 2 | colloidal zirconia | 0.5 | 70 | 40 | — | — | — |
| Comparative Example 3 | colloidal zirconia | 0.5 | 250 | 35 | — | — | — |
| Comparative Example 4 | cation-modified colloidal silica | 2.0 | 70 | 40 | — | — | — |
| Comparative Example 5 | cation-modified colloidal silica | 2.0 | 70 | 40 | — | — | — |

| | Selectivity improver (2) | | Selectivity improver (3) | | pH | |
|---|---|---|---|---|---|---|
| | type | concentration (% by mass) | type | concentration (% by mass) | adjusting agent | pH |
| Example 1 | 10-camohorsulfonic acid | 0.05 | — | — | — | 3.7 |
| Example 2 | 10-camphorsulfonic acid | 0.05 | — | — | — | 3.7 |
| Example 3 | 10-camphorsulfonic acid | 0.05 | — | — | — | 3.7 |
| Example 4 | 10-camphorsulfonic acid | 0.05 | — | — | — | 3.7 |
| Example 5 | 10-camohorsulfonic acid | 0.05 | — | — | — | 3.7 |
| Example 6 | 10-camphorsulfonic acid | 0.05 | — | — | — | 3.7 |
| Example 7 | 10-camphorsulfonic acid | 0.05 | — | — | — | 3.7 |
| Example 8 | 10-camphorsulfonic acid | 0.05 | — | — | — | 3.7 |
| Example 9 | 10-camphorsulfonic acid | 0.05 | — | — | — | 3.7 |
| Example 10 | 10-camphorsulfonic acid | 0.1 | — | — | — | 3.0 |
| Example 11 | 10-camphorsulfonic acid | 0.01 | — | — | — | 5.5 |
| Example 12 | 10-camphorsulfonic acid | 0.05 | — | — | — | 3.7 |
| Example 13 | — | — | — | — | nitric acid | 3.7 |
| Example 14 | — | — | sodium 1-hexanesulfonate | 0.01 | nitric acid | 3.7 |
| Example 15 | — | — | — | — | nitric acid | 3.7 |
| Example 16 | — | — | — | — | nitric acid | 3.7 |
| Example 17 | 10-camphorsulfonic acid | 0.05 | — | — | — | 3.7 |
| Example 18 | 10-camphorsulfonic acid | 0.05 | — | — | — | 3.7 |
| Example 19 | 10-camphorsulfonic acid | 0.05 | — | — | — | 3.7 |
| Example 20 | 10-camphorsulfonic acid | 0.05 | ammonium lauryl sulfate | 0.005 | — | 3.7 |
| Example 21 | 10-camphorsulfonic acid | 0.05 | sodium 1-hexanesulfonafe | 0.01 | — | 3.7 |
| Example 22 | 10-camphorsulfonic acid | 0.05 | sodium 1-hexanesulfonate | 0.005 | — | 3.7 |
| Comparative Example 1 | 10-camphorsulfonic acid | 0.0001 | — | — | — | 7.0 |
| Comparative Example 2 | — | | — | — | nitric acid | 3.7 |

TABLE 1-continued

| | | | | | | |
|---|---|---|---|---|---|---|
| Comparative Example 3 | — | — | — | — | nitric acid | 3.7 |
| Comparative Example 4 | 10-camphorsulionic acid | 0.05 | — | — | nitric acid | 3.7 |
| Comparative Example 5 | — | — | — | — | nitric acid | 3.7 |

[Polishing Speed]

A silicon wafer in which amorphous carbon was formed on the surface with a thickness of 5000 Å (manufactured by ADVANTEC CO., LTD., 200 mm wafer, SKA, P-type, substrate of material (b)) and a 200 mm wafer ($Si_3N_4$ (silicon nitride film) manufactured by Advanced Materials Technology, INC. product name: LP-SiN 3.5KA Blanket, substrate of material (a)) were prepared as objects to be polished (substrates).

Using the polishing composition obtained above, each of the prepared substrates was polished under the following polishing conditions, and the polishing speed was measured:

(Polishing Conditions)

Polishing machine: EJ-380IN-CH (manufactured by Engis Japan Corporation)

Polishing pad: hard polyurethane pad (manufactured by Rohm and Haas Company, IC1010)

Polishing pressure: 1.0 psi (1 psi=6894.76 Pa)

Rotation number of platen (surface plate): 80 rpm (1.33 $s^{-1}$)

Rotation number of head (carrier): 60 rpm (1.0 $s^{-1}$)

Flow rate of polishing composition: 100 ml/min

Polishing time: 60 seconds.

(Polishing Speed)

The film thickness was determined by an optical interference type film thickness measurement apparatus (manufactured by SCREEN Holdings Co., Ltd., model number: LAMBDA ACE VM-2030), and the polishing speed was evaluated by dividing the difference between the film thicknesses before and after polishing by the polishing time (see the following formula). The polishing speed for the organic material (b) is preferably 90 Å/min or more.

$$\text{Polishing speed}\,(\text{Å/min}) = \frac{[\text{Film thickness before polishing of object to be polished (Å)}] - [\text{Film thickness after polishing of object to be polished (Å)}]}{[\text{Polishing time (min)}]} \quad \text{[Math. 2]}$$

(Selectivity)

The selectivity was determined by dividing the polishing speed for the organic material substrate obtained above by the polishing speed for the $Si_3N_4$ substrate. The selectivity is preferably 30 or more.

The evaluation results of the polishing composition of each Example and each Comparative Example are shown in Table 2 below.

TABLE 2

| | Polishing speed (Å/min) | | Organic material(b)/SiN(a) |
|---|---|---|---|
| | organic material (b) | SiN (a) | polishing speed ratio (selectivity) |
| Example 1 | 95 | 1 | 95 |
| Example 2 | 120 | 2 | 60 |
| Example 3 | 145 | 4 | 36 |
| Example 4 | 115 | 1 | 115 |
| Example 5 | 110 | 1 | 110 |
| Example 6 | 107 | 1 | 107 |
| Example 7 | 103 | 1 | 103 |
| Example 8 | 100 | 1 | 100 |
| Example 9 | 101 | 1 | 101 |
| Example 10 | 104 | 1 | 104 |
| Example 11 | 111 | 1 | 111 |
| Example 12 | 130 | 3 | 43 |
| Example 13 | 109 | 2 | 55 |
| Example 14 | 134 | 2 | 67 |
| Example 15 | 100 | 2 | 50 |
| Example 16 | 131 | 3 | 44 |
| Example 17 | 128 | 2 | 64 |
| Example 18 | 131 | 2 | 66 |
| Example 19 | 125 | 2 | 63 |
| Example 20 | 138 | 1 | 138 |
| Example 21 | 140 | 1 | 140 |
| Example 22 | 138 | 1 | 138 |
| Comparative Example 1 | 23 | 3 | 8 |
| Comparative Example 2 | 108 | 9 | 12 |
| Comparative Example 3 | 156 | 21 | 7 |
| Comparative Example 4 | 43 | 5 | 9 |
| Comparative Example 5 | 54 | 12 | 5 |

As is clear from Table 2 above, it was found that the polishing compositions of Examples can polish the organic material (b) at a high polishing speed, and can improve the ratio of the polishing speed for the organic material (b) to the polishing speed for the material (a) having a metal-nitrogen bond.

The present application is based on the Japanese patent application No. 2021-151945 filed on Sep. 17, 2021, the disclosure of which is incorporated herein by reference in its entirety.

The invention claimed is:

1. A polishing composition comprising:

colloidal zirconia particles doped with yttrium or an oxide thereof;

a selectivity improver for improving a ratio of a polishing speed for an organic material (b) to a polishing speed for a material (a) having a metal-nitrogen bond; and a dispersing medium, wherein:

in a particle size distribution of the colloidal zirconia particles obtained by a laser diffraction/scattering method, a diameter (D50) of the colloidal zirconia particles when a cumulative volume of the colloidal zirconia particles from a fine particle side reaches 50% of a total volume of the particles is 5 nm or more and 150 nm or less;

the selectivity improver comprises a non-aromatic bridged cyclic compound having an organic acid group or a salt group thereof;

a content of the non-aromatic bridged cyclic compound having an organic acid group or a salt group thereof is 0.001% by mass or more and 10% by mass or less, based on the total mass of the polishing composition; and a pH of the polishing composition is less than 7.

2. The polishing composition according to claim 1, wherein the non-aromatic bridged cyclic compound having an organic acid group or a salt group thereof is a compound represented by the following general formula 1:

(General Formula 1)

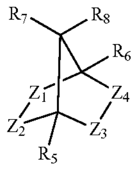

wherein:

$Z_1$ is $CR_1R_1'$, C═O, or O;

$Z_2$ is $CR_2R_2'$, C═O, or O;

$Z_3$ is $CR_3R_3'$, C═O, or O;

$Z_4$ is $CR_4R_4'$, C═O, or O;

$R_1$, $R_1'$, $R_2$, $R_2'$, $R_3$, $R_3'$, $R_4$, $R_4'$, $R_5$, $R_6$, $R_7$, and $R_8$ are each independently a hydrogen atom, a deuterium atom, a halogen atom, a substituted or unsubstituted alkyl group, a substituted or unsubstituted alkenyl group, a substituted or unsubstituted alkynyl group, a substituted or unsubstituted alkoxy group, a substituted or unsubstituted polyoxyalkylene group, or an organic acid group or a salt group thereof;

when at least one of $R_1$, $R_1'$, $R_2$, $R_2'$, $R_3$, $R_3'$, $R_4$, $R_4'$, $R_5$, $R_6$, $R_7$, and $R_8$ is a substituted group, it is substituted with a substituent selected among a deuterium atom, a halogen atom, an unsubstituted alkyl group, an unsubstituted alkenyl group, an unsubstituted alkynyl group, an unsubstituted alkoxy group, an unsubstituted polyoxyalkylene group, or an organic acid group or a salt group thereof; and at least one of $R_1$, $R_1'$, $R_2$, $R_2'$, $R_3$, $R_3'$, $R_4$, $R_4'$, $R_5$, $R_6$, $R_7$, and $R_8$ contains an organic acid group or a salt group thereof.

3. The polishing composition according to claim 2, wherein the compound represented by general formula 1 is 10-camphorsulfonic acid.

4. The polishing composition according to claim 1, which is used for polishing an object to be polished comprising the material (a) having a metal-nitrogen bond and the organic material (b).

5. The polishing composition according to claim 1, wherein the selectivity improver further comprises a water-soluble polymer having a polar group.

6. The polishing composition according to claim 5, wherein the water-soluble polymer having a polar group comprises at least one selected from the group consisting of polyvinyl alcohol, polyvinylpyrrolidone, and polyacrylamide.

7. The polishing composition according to claim 6, wherein the water-soluble polymer having a polar group comprises at least one selected from the group consisting of polyvinyl alcohol and polyvinylpyrrolidone.

8. The polishing composition according to claim 7, wherein the water-soluble polymer having a polar group comprises polyvinylpyrrolidone.

9. The polishing composition according to claim 1, wherein the selectivity improver further comprises an anionic surfactant.

10. The polishing composition according to claim 9, wherein the anionic surfactant comprises a sulfonic acid-type anionic surfactant or a sulfuric acid ester-type anionic surfactant.

11. The polishing composition according to claim 10, wherein the anionic surfactant is a sulfonic acid-type anionic surfactant selected from the group consisting of sodium lauryl sulfoacetate, sodium 1-propanesulfonate, sodium 1-butanesulfonate, sodium 1-pentanesulfonate, sodium 1-hexanesulfonate, sodium 1-heptanesulfonate, sodium 1-octanesulfonate, sodium 1-decanesulfonate, sodium 1-dodecanesulfonate, sodium toluenesulfonate, sodium cumenesulfonate, sodium naphthalenesulfonate, disodium naphthalenedisulfonate, trisodium naphthalenetrisulfonate, sodium alpha-olefinsulfonate, and sodium dodecylbenzenesulfonate, or a sulfuric acid ester-type anionic surfactant selected from the group consisting of sodium lauryl sulfate, sodium myristyl sulfate, sodium laureth sulfate (sodium polyoxyethylene lauryl ether sulfate), sodium cetyl sulfate, sodium cocoglyceryl sulfate (sodium hydrogenated coconut oil fatty acid glyceryl sulfate), triethanolamine lauryl sulfate, ammonium lauryl sulfate, and triethanolamine laureth sulfate.

12. The polishing composition according to claim 10, wherein the anionic surfactant is sodium 1-hexanesulfonate or ammonium lauryl sulfate.

13. The polishing composition according to claim 1, wherein the selectivity improver further contains at least one of a water-soluble polymer having a polar group and at least one of an anionic surfactant.

14. The polishing composition according to claim 13, wherein the water-soluble polymer having a polar group is polyvinyl alcohol or polyvinylpyrrolidone; and the anionic surfactant is a sulfonic acid-type anionic surfactant or a sulfuric acid ester-type anionic surfactant.

15. The polishing composition according to claim 1, wherein the content of the non-aromatic bridged cyclic compound having an organic acid group or a salt group thereof is 0.005% by mass or more and 0.3% by mass or less, based on the total mass of the polishing composition.

16. The polishing composition according to claim 1, wherein the content of the non-aromatic bridged cyclic compound having an organic acid group or a salt group thereof is 0.01% by mass or more and 0.1% by mass or less, based on the total mass of the polishing composition.

17. The polishing composition according to claim 1, wherein the diameter (D50) of the colloidal zirconia particles when a cumulative volume of the colloidal zirconia particles from a fine particle side reaches 50% of a total volume of the particles is 90 nm or less.

18. The polishing composition according to claim 1, wherein a content of the colloidal zirconia particles is 0.01% by mass or more and less than 1% by mass, based on the total mass of the polishing composition.

19. A polishing method comprising a step of polishing an object to be polished comprising the material (a) having a metal-nitrogen bond and the organic material (b) using the polishing composition according to claim 1.

20. A method for producing a semiconductor substrate, comprising a step of polishing a semiconductor substrate comprising the material (a) having a metal-nitrogen bond and the organic material (b) by the polishing method according to claim 19.

* * * * *